United States Patent
Manning

(10) Patent No.: US 6,258,671 B1
(45) Date of Patent: *Jul. 10, 2001

(54) METHODS OF PROVIDING SPACERS OVER CONDUCTIVE LINE SIDEWALLS, METHODS OF FORMING SIDEWALL SPACERS OVER ETCHED LINE SIDEWALLS, AND METHODS OF FORMING CONDUCTIVE LINES

(75) Inventor: H. Montgomery Manning, Kuna, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/855,517

(22) Filed: May 13, 1997

(51) Int. Cl.$^7$ ................................................. H01L 21/8234
(52) U.S. Cl. ......................... 438/275; 438/585; 438/587; 438/592; 438/595
(58) Field of Search ................................... 438/595, 622, 438/695, 696, 275, 238, 241, 258, 624, 585, 587, 588, 592; 257/315

(56) References Cited

U.S. PATENT DOCUMENTS

| | | | |
|---|---|---|---|
| 4,931,411 | 6/1990 | Tigelaar et al. ........................ | 437/192 |
| 5,005,066 | * 4/1991 | Chen ...................................... | 257/315 |
| 5,034,798 | * 7/1991 | Ohsima ................................. | 257/315 |
| 5,126,290 | * 6/1992 | Lowrey et al. ........................ | 438/600 |
| 5,164,806 | * 11/1992 | Nagamoto et al. .................... | 257/395 |
| 5,175,120 | * 12/1992 | Lee ........................................ | 438/201 |
| 5,289,422 | 2/1994 | Mametani ............................. | 365/210 |
| 5,292,681 | * 3/1994 | Lee et al. ............................... | 438/201 |
| 5,329,482 | 7/1994 | Nakajima et al. .................... | 365/182 |
| 5,346,585 | * 9/1994 | Doan et al. ........................... | 438/690 |
| 5,356,834 | * 10/1994 | Sugimoto et al. .................... | 438/624 |
| 5,439,846 | * 8/1995 | Nguyen et al. ....................... | 438/595 |
| 5,668,035 | 9/1997 | Fang et al. ............................ | 438/239 |
| 5,733,809 | 3/1998 | Dennison et al. .................... | 438/253 |
| 5,739,068 | 4/1998 | Jost et al. .............................. | 438/637 |

(List continued on next page.)

FOREIGN PATENT DOCUMENTS 2 253 937 9/1992 (GB).
409064294 3/1997 (JP).

*Primary Examiner*—Stephen D. Meier
*Assistant Examiner*—Maria Guerrero
(74) *Attorney, Agent, or Firm*—Wells, St. John, Roberts, Gregory & Matkin

(57) ABSTRACT

Methods of forming conductive lines and insulative spacers thereover are described. In accordance with one aspect of the invention, a substrate is provided having a first area and a second area relative to which conductive lines are to be formed. A layer of conductive material is formed over the first and second substrate areas and a layer of insulative material is formed over the conductive material. In a preferred implementation, insulative material is removed from the second area and conductive lines are subsequently patterned and etched in both the first and second areas. In another preferred implementation, conductive lines are first patterned and etched with insulative material in the second area being subsequently removed. The patterned and etched conducted lines have respective sidewalls. Subsequently, a layer of insulative material is formed over the substrate, the conductive lines, and the respective sidewalls thereof, and in at least one common etching step, the insulative material is etched to a degree sufficient to form sidewall spacers over the respective sidewalls. In accordance with one aspect, the one common etching step comprises an anisotropic etching step. In accordance with another aspect, the one common etching step comprises at least one facet etching step.

7 Claims, 6 Drawing Sheets

U.S. PATENT DOCUMENTS

| | | | |
|---|---|---|---|
| 5,759,889 | 6/1998 | Sakao | 438/241 |
| 5,763,954 | 6/1998 | Hyakutake | 257/775 |
| 5,780,882 | 7/1998 | Sugiura et al. | 257/203 |
| 5,792,684 * | 8/1998 | Lee et al. | 438/238 |
| 5,821,600 | 10/1998 | Chan | 257/508 |
| 5,898,006 * | 4/1999 | Kudoh | 438/275 |

* cited by examiner

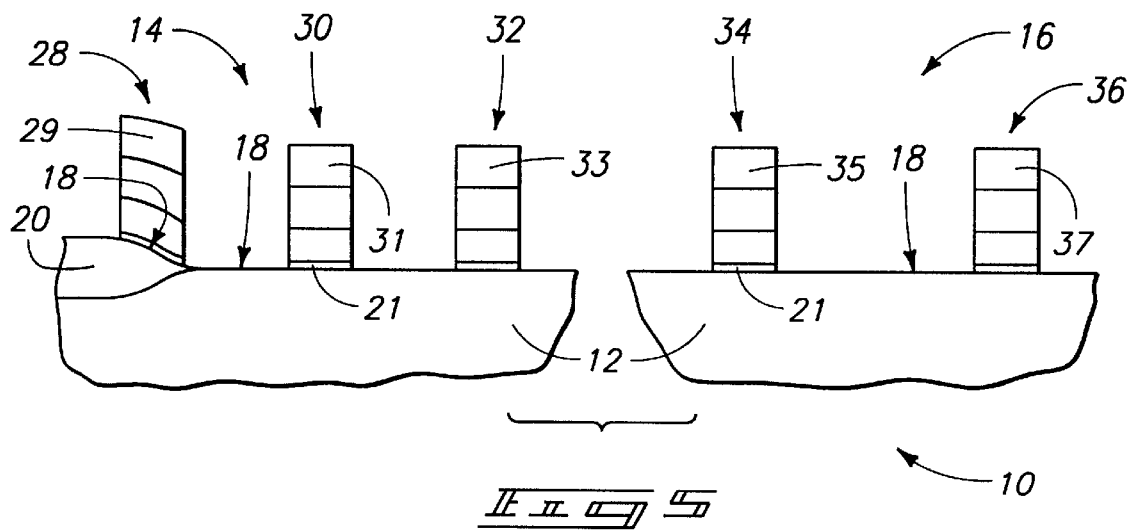
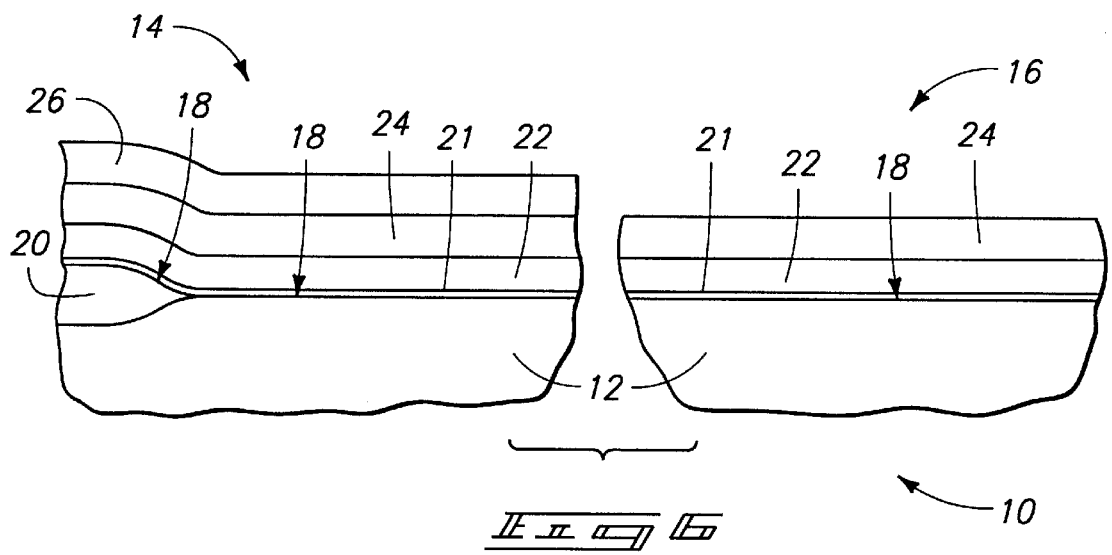

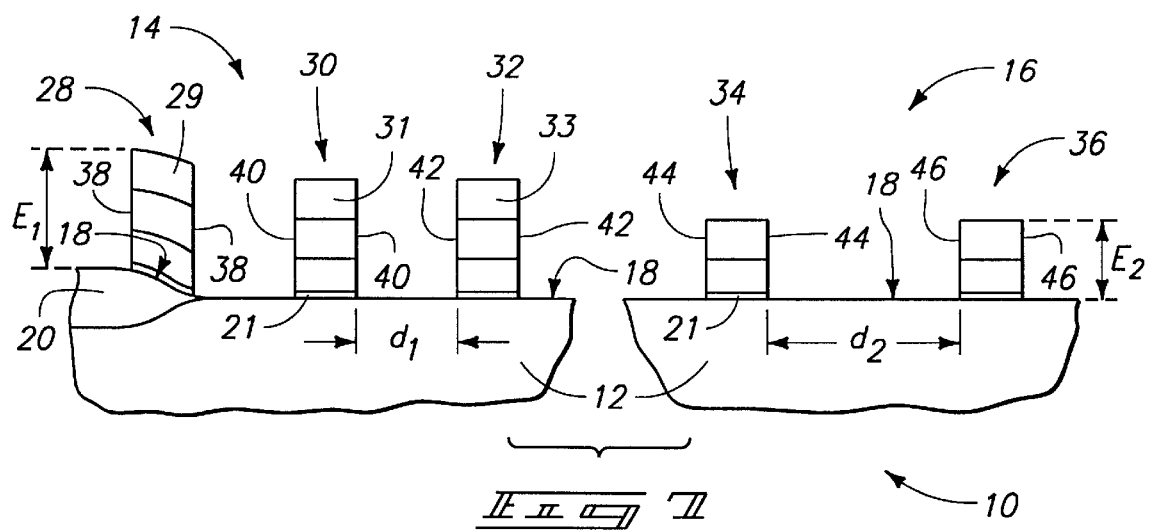
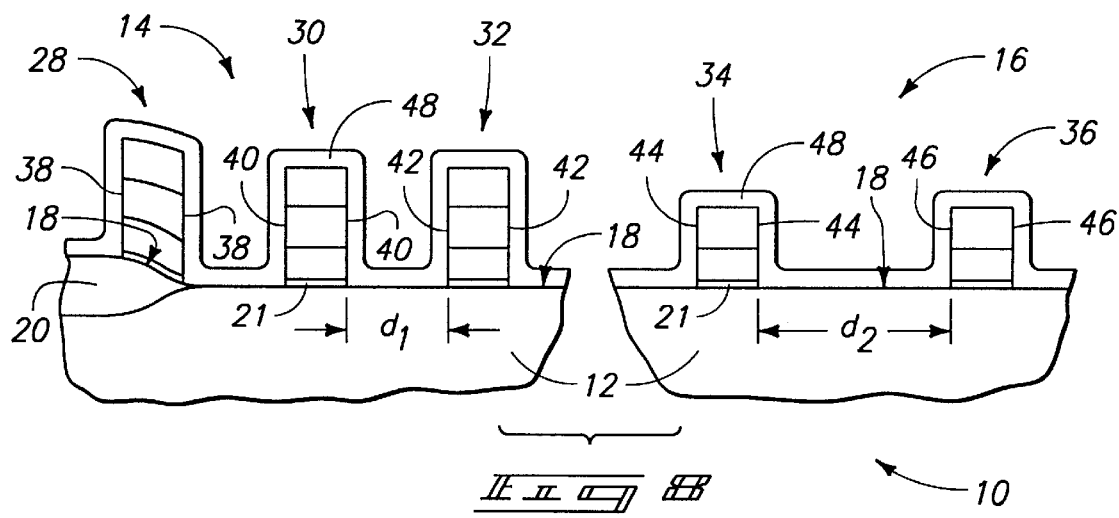

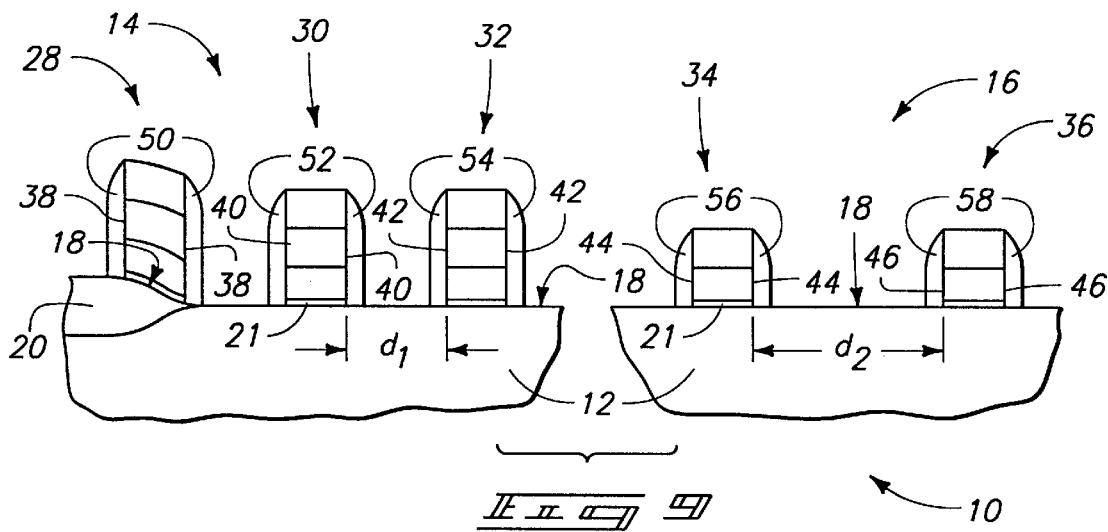
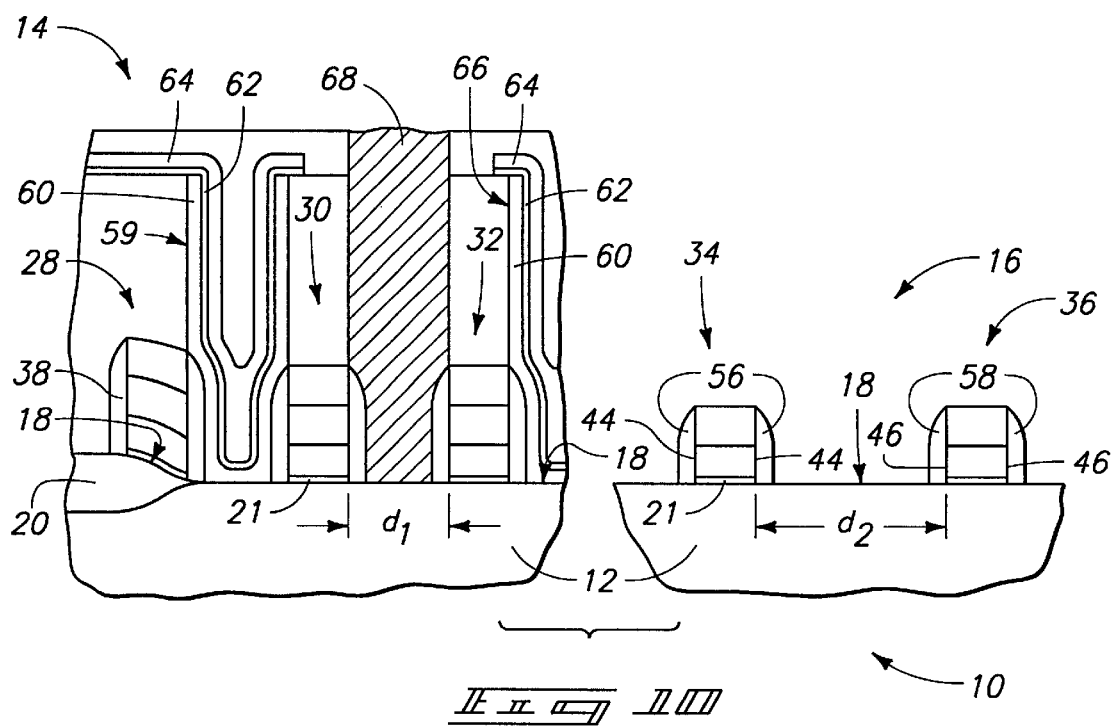

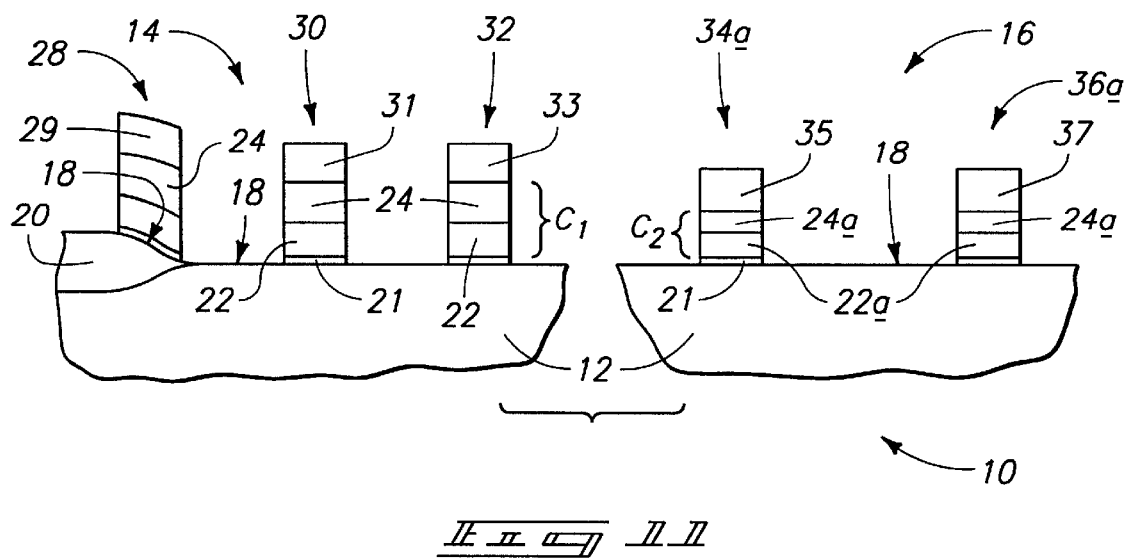

US 6,258,671 B1

METHODS OF PROVIDING SPACERS OVER CONDUCTIVE LINE SIDEWALLS, METHODS OF FORMING SIDEWALL SPACERS OVER ETCHED LINE SIDEWALLS, AND METHODS OF FORMING CONDUCTIVE LINES

TECHNICAL FIELD

This invention relates to methods of forming conductive lines, insulative spacers over conductive line sidewalls, and memory circuitry.

BACKGROUND OF THE INVENTION

Fabrication of integrated circuitry involves the formation of conductive lines over a substrate. Such conductive lines are used to connect to or with device components. One type of integrated circuitry is memory circuitry. Memory circuitry typically includes a memory array in which storage devices are fabricated as close as lithography allows in order to conserve wafer space. Memory circuitry also typically includes peripheral circuitry in which spacing requirements are not as paramount as in the memory array. Accordingly, devices in the peripheral circuitry are typically spaced further apart relative to devices in the memory array.

The disparity in spacing between conductive lines in the memory array relative to those lines in the peripheral area leads to a problem which this invention addresses. Specifically, conductive lines typically include sidewall spacers which electrically insulate sides of the conductive lines. The sidewall spacers are typically formed by forming a layer of insulative material over the substrate and anisotropically etching the layer to leave spacers about the conductive lines.

It is well known that the conformality of deposited insulative material over closely spaced conductive lines is worse than on lines which are spaced further apart. Because of this, peripheral devices tend to have larger dimensioned spacers than array devices. Such larger dimensions typically manifest in larger lateral spacer width dimensions. Because the spacer dimension is typically set by the processing required to optimize devices in the memory array, the peripheral devices can be compromised by having larger spacers than would be the case if the spacers were optimized for the peripheral devices. Larger dimensioned spacers adversely affect electrical properties associated with the lines and degrade device performance. Device reliability may also suffer if lightly doped drain regions are not used. Such is typically the case in some low $V_{cc}$ processes.

This invention arose out of concerns associated with providing methods to enhance the performance of peripheral devices without compromising the performance of the array devices.

SUMMARY OF THE INVENTION

Methods of forming conductive lines and insulative spacers thereover are described. In accordance with one aspect of the invention, a substrate is provided having a first area and a second area relative to which conductive lines are to be formed. A layer of conductive material is formed over the first and second substrate areas and a layer of insulative material is formed over the conductive material. In a preferred implementation, insulative material is removed from the second area and conductive lines are subsequently patterned and etched in both the first and second areas. In another preferred implementation, conductive lines are first patterned and etched with insulative material in the second area being subsequently removed. The patterned and etched conducted lines have respective sidewalls. Subsequently, a layer of insulative material is formed over the substrate, the conductive lines, and the respective sidewalls thereof, and in at least one common etching step, the insulative material is etched to a degree sufficient to form sidewall spacers over the respective sidewalls. In accordance with one aspect, the one common etching step comprises an anisotropic etching step. In accordance with another aspect, the one common etching step comprises at least one facet etching step.

BRIEF DESCRIPTION OF THE DRAWINGS

Preferred embodiments of the invention are described below with reference to the following accompanying drawings.

FIG. 5 is a view of the FIG. 1 wafer at a processing step subsequent to that shown by FIG. 4.

FIG. 6 is a view of the FIG. 4 wafer at a processing step in accordance with an alternate embodiment of the invention.

FIG. 7 is a view of the FIG. 1 wafer fragment at a processing step subsequent to that shown by either of FIGS. 5 or 6.

FIG. 8 is a view of the FIG. 1 wafer at a processing step subsequent to that shown by FIG. 7.

FIG. 9 is a view of the FIG. 1 wafer at a processing step subsequent to that shown by FIG. 8.

FIG. 10 is a view of the FIG. 1 wafer at a processing step subsequent to that shown by FIG. 9.

FIG. 11 is a view of a semiconductor wafer fragment at one processing step in accordance with an alternate embodiment of the invention.

DETAILED DESCRIPTION OF THE PREFERRED EMBODIMENTS

Figure 1:
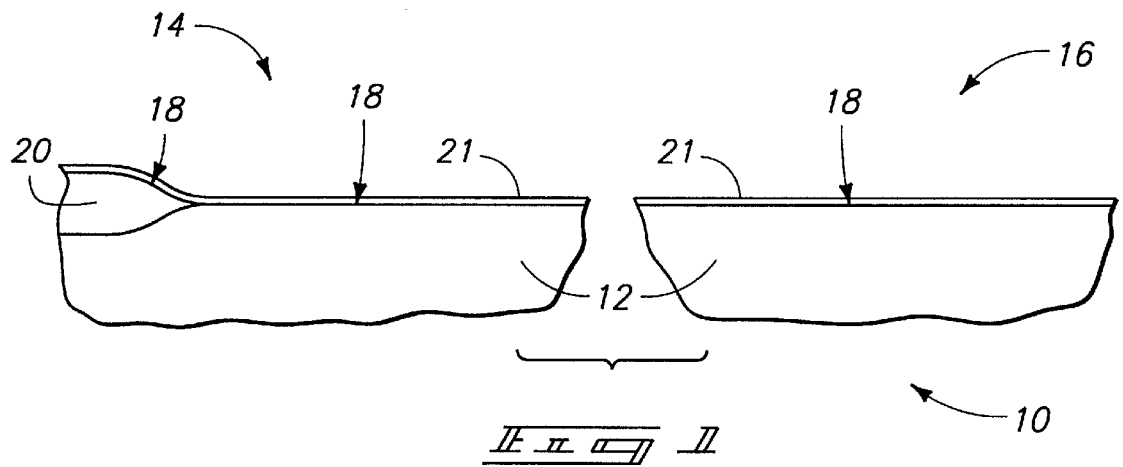
FIG. 1 is a diagrammatic sectional view of a semiconductor wafer fragment at one processing step in accordance with one embodiment of the invention.

Referring to FIG. 1, a semiconductor wafer fragment in process is indicated generally by reference numeral 10 and includes a semiconductive substrate 12. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The illustrated substrate 12 includes a first area 14 and a second area 16. In a preferred implementation, first area 14 constitutes a memory array area or memory array for supporting memory integrated circuitry, and second area 16 constitutes a peripheral area or periphery which is spaced from the memory array and supports peripheral circuitry. According to one aspect of the invention, the memory array area constitutes a portion of a static random access memory device or SRAM. According to another aspect of the invention, the memory array area constitutes a portion of a dynamic random access memory device or DRAM. Areas 14 and 16 include isolation oxide regions which provide isolation relative to circuitry which will be formed. An exemplary fragmentary isolation oxide region is indicated at 20. Areas 14 and 16 include an outer surface 18 relative to which conductive lines are to be formed. Outer surface 18 can constitute a non-planar outer surface. A thin oxide layer 21 is provided over outer surface 18 and constitutes a gate oxide layer for conductive lines or transistor gates which are to be formed.

Figure 2:
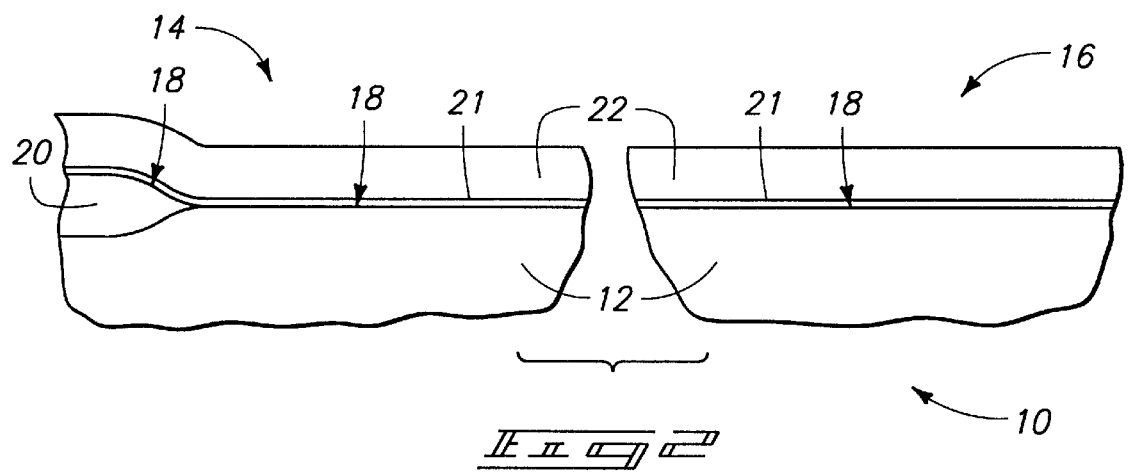
FIG. 2 is a view of the FIG. 1 wafer at a processing step subsequent to that shown by FIG. 1.

Referring to FIG. 2, a layer 22 of conductive material is formed over substrate 12 and first and second substrate areas 14, 16 respectively. A suitable material for layer 22 is conductively doped polysilicon.

Figure 3:
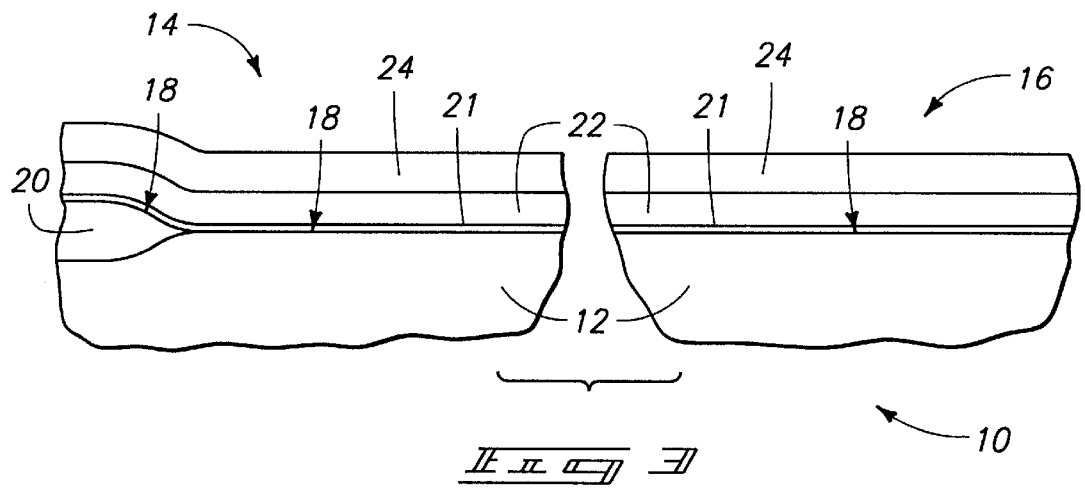
FIG. 3 is a view of the FIG. 1 wafer at a processing step subsequent to that shown by FIG. 2.

Referring to FIG. 3, a layer of conductive material, and preferably a refractory metal layer, is formed over the substrate and reacted to form a conductive silicide layer 24. A suitable material for layer 24 is $WSi_x$. It is to be understood, however, that the above-described specific conductive layers are utilized for illustrative purposes only. Accordingly, conductive materials other than those discussed above, either alone or in combination with other conductive materials can be used.

Figure 4:
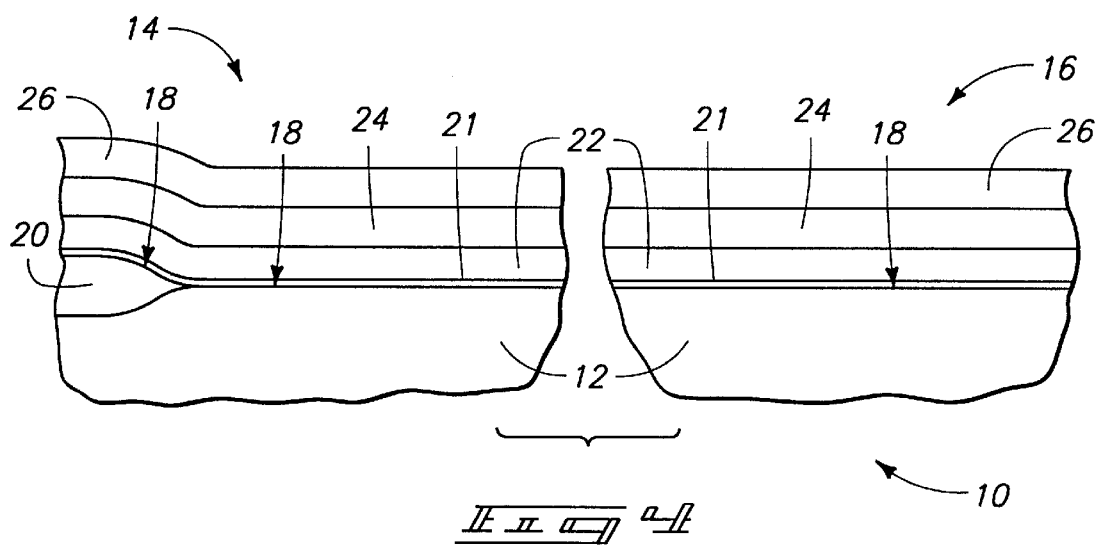
FIG. 4 is a view of the FIG. 1 wafer at a processing step subsequent to that shown by FIG. 3.

Referring to FIG. 4, a layer 26 of first insulative material is formed over conductive material layer 24. According to one aspect of the invention, such insulative material is formed over both areas 14, 16 at the same time. It is possible, however, for first insulative material to be formed over only one of the areas. It is also possible, in certain implementations, for first insulative material to be formed over only portions of both areas, or, over area 14 and only portions of area 16. $SiO_2$ is an example material for insulative layer 26.

Referring to FIG. 5, and in accordance with one implementation of the invention, the conductive material of layers 22, 24 (FIG. 4) and first insulative material layer 26 are patterned and etched to form conductive lines 28, 30, and 32 in first area 14, and conductive lines 34, 36 in second area 16. Accordingly, individual conductive lines in both areas 14 and 16 include respective insulative or insulating caps 29, 31, 33, 35, and 37, and consist of a singular conductive mass in layers 22/24 and at least one dielectric layer (i.e., layers 21 and 26). The term "conductive line" as used in this document will be understood to mean a conductive line construction which may or may not include insulative or insulating portions or caps such as caps 29, 31, 33, 35, and 37. Subsequently, after the patterning and etching of the conductive lines, insulative material forming insulating caps 35 and 37 is removed from second area 16 to provide a resultant conductive line construction which is shown in FIG. 7. The removal of insulating caps 35 and 37 can, and preferably does take place through a suitable masked etch thereof. It will be understood that in certain implementations, it may be desirable to remove only some of the insulating caps from conductive lines in peripheral area 16. Such would be the case, for example, when fabricating electrostatic discharge (ESD) devices where having a larger spacer dimension is desirable. Such constitutes removing insulative material from over less than all of a plurality of etched lines. Accordingly, the lines over which the insulative material is removed (lines 34, 36 in FIG. 7) are shorter than lines over which the insulative material is not removed (lines 28, 30, and 32).

Referring to FIG. 6, another implementation of the invention is set forth, and is one which follows from the FIG. 4 construction. Accordingly, insulative material 26 (FIG. 4) from over the conductive material in second area 16 is removed prior to the formation of any conductive lines in such area. Such constitutes one example of forming a layer of insulative material 26 over the conductive material in first area 14 while leaving conductive material in second area 16 exposed. Accordingly, in the resultant FIG. 6 construction, insulative material is formed over conductive material in the first area only. The removal of the insulative material from second area 16 is preferably effectuated through a masked etch thereof. After the forming of the insulative material layer as just described, the conductive material of layers 22 and 24 is patterned and etched to form conductive lines in both first and second substrate areas 14, 16 as shown in FIG. 7. As with the FIG. 5 implementation discussed above relative to fabricating ESD devices, it may be desirable in certain implementations to leave insulative material over portions of peripheral area 16. Processing in this instance would proceed as described just above.

Referring to FIG. 7 and in accordance with a preferred aspect of the invention, conductive lines 28, 30, and 32 constitute conductive lines which are disposed in the memory array area and spaced as close together as lithography permits. Such line spacing constitutes a first line spacing which is indicated by a first distance $d_1$ which constitutes a minimum lithographic spacing dimension. Area 16 constitutes a peripheral area in which the illustrated conductive lines 34, 36 are disposed and laterally spaced relative to one another a second line spacing which is indicated by a second distance $d_2$ which is different from $d_1$. In the illustrated example, $d_2$ is greater than $d_1$. Accordingly, at least some of the lines have line spacings relative to adjacent lines which are different from line spacings of other lines relative to other adjacent lines.

Conductive lines 28, 30, 32, 34, and 36 include respective sidewalls 38, 40, 42, 44, and 46. Sidewalls 38, 40, and 42 define line elevations $E_1$ relative to outer surface 18 in first area 14. Sidewalls 44 and 46 define line elevations $E_2$ relative to outer surface 18 in second area 16. $E_1$ and $E_2$ are preferably different as between first area 14 and second area 16. The difference in line elevations stems from the conductive lines in first area 14 having insulative caps and the conductive lines in second area 16 not having insulative caps. Accordingly, line elevations relative to surface 18 in first area 14 are greater than line elevations in second area 16. Conductive lines 28, 30, and 32 constitute first conductive lines and conductive lines 34 and 36 constitute second conductive lines. The first conductive lines project elevationally outward from outer surface 18 a greater distance than the second conductive lines project. Accordingly, at least some of the conductive lines project outward relative to the substrate outer surface a greater distance than other conductive lines. Alternately considered, at least some of the first area conductive lines have aspect ratios (height-to-width ratios) which are greater than aspect ratios of at least some of the second area conductive lines.

Referring to FIG. 8, a layer 48 of insulative spacer material is formed over the substrate and conductive lines 28, 30, 32, 34, and 36. Typically, layer 48 is provided through decomposition of tetraethylorthosilicate (TEOS). Layer 48 constitutes a second insulative material.

Referring to FIG. 9 and in accordance with one aspect of the invention, at least one common etching step is conducted and etches insulative material 48 in both areas 14 and 16. Such provides respective resultant insulative sidewall spacers 50, 52, 54, 56, and 58 which are operably disposed over their respective conductive line sidewalls. In accordance with one preferred aspect of the invention, a common anisotropic etching of insulative material 48 forms the illustrated sidewall spacers. In accordance with another preferred aspect of the invention, the etching of the sidewall spacers includes a common facet etching of insulative material 48. Typically, an initial facet etching of layer 48 takes place which is followed by deposition of additional insulative material. Subsequently, an anisotropic etch to form resultant spacers, or, additional depositions and facet etchings can take place. In the latter case, an anisotropic etch can be incorporated into the is etching sequence (after multiple deposition/facet etching steps) to provide a resultant spacer construction. Accordingly, such would constitute conducting at least two facet etchings. Preferably, the sidewall spacers which are formed relative to the shorter of the conductive lines (lines 34, 36) have lateral width dimensions which are substantially equal to the lateral width dimensions of the sidewall spacers of the taller of the conductive lines (lines 28, 30, and 32). Accordingly, such constitutes forming sidewall spacers relative to the shorter and more laterally distant lines, the sidewall spacers having reduced spacer widths than would otherwise occur in the presence of the removed or etched insulative material. Alternately considered and in accordance with one aspect of the invention, spacers having substantially common width dimensions are formed over conductive lines having different heights.

Referring to FIG. 10 and in accordance with one aspect of the invention, dynamic random access memory (DRAM) circuitry is formed relative to memory array area 14. Accordingly, a storage capacitor 59 includes a layer 60 of storage node material which is formed over memory array area 14 and between at least some of the conductive lines. A layer 62 of dielectric material is formed over storage node material layer 60. A cell plate layer 64 is subsequently formed operatively adjacent dielectric layer 62 to provide a storage capacitor. Other storage capacitors are similarly formed and operably disposed within the memory array area. A fragmentary portion of one such storage capacitor is indicated at 66. A bit line contact 68 is formed adjacent and operably associated with storage capacitors 59, 66. Bit line contact 68 is suitably insulated from the storage capacitors.

Referring to FIG. 11, an alternate embodiment is shown. Like numbers from the above-described embodiment(s) are utilized where appropriate, with differences being indicated with the suffix "a" or with different numerals. In the illustrated embodiment, conductive lines 28, 30, and 32 have conductive portions $C_1$ comprised of layers 22, 24. Conductive lines 34a and 36a have conductive portions $C_2$ comprised of layers 22a and 24a. Conductive lines 28, 30, and 32 project outwardly from substrate outer surface 18 a greater distance than conductive lines 34a and 36a project. In the illustrated example, the conductive portions $C_1$ project a greater distance relative to the substrate outer surface than conductive portions $C_2$. Accordingly, respective conductive portions $C_1$ are greater in elevational height or thickness than respective conductive portions $C_2$. Insulative caps 29, 31, 33, 35, and 37 are shown to have similar dimensions as the above described embodiments. In the present embodiment, manipulation of the spacer dimensions to achieve a desired result is accomplished by providing conductive lines with differently dimensioned conductive portions. In the present example, some of the conductive material comprising conductive lines 34a and 36a has been removed. Thus, conductive line height or thickness is manipulated not through the selective removal of insulative caps, but rather through the manipulation of the amounts of conductive material utilized to form the respective conductive lines. Accordingly, it should be apparent that although the peripheral area lines are illustrated to have reduced conductive portions ($C_2$) relative to conductive portions $C_1$ of the memory array conductive lines, the desired line projection differential can be achieved by adding conductive material to the conductive portions of the memory array conductive lines.

It will also be apparent that there are a number of ways to achieve conductive lines having reduced conductive portions relative to other conductive lines. For example, certain patterned lines might simply be thinned down relative to other conductive lines through suitable removal techniques such as masked etching. Another way of providing such lines might be to pattern some, but not all of the lines and then form additional conductive material over unpatterned regions. Subsequently, the unpatterned regions can be patterned to provide resultant line constructions with thicker conductive portions.

The above described methodology provides for more standardization of the dimensions of sidewall spacers which are formed relative to conductive lines which are not necessarily uniformly spaced or disposed relative to one another over a substrate. Such enhances device performance with little extra processing requirements. The inventive methodology can be employed in processing scenarios where devices with greater hot-electron injection capabilities are desired to be formed. Additionally, ESD devices with lower snap-back voltages may be formed utilizing the inventive methodology. Such was described above in connection with forming insulative caps over only some of the conductive lines in peripheral area 16 to provide larger-dimensioned spacers relative to those lines having the insulative caps. The inventive methodology can also be utilized to form conductive lines having variable elevational heights relative to one another, with the resultant sidewall spacers formed thereover having variable dimensions as well. Additionally, it will be appreciated that although the invention has been described in the context of memory devices and in particular DRAM integrated circuitry, non-memory integrated circuitry can be formed in accordance with the invention as well.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming sidewall spacers over etched line sidewalls comprising:

depositing and etching conductive material over a substrate outer surface to form at least a first plurality of conductive lines, the first plurality of etched conductive lines respectively consisting of a singular conductive mass and at least one dielectric layer;

removing at least some capping insulative material from over less than all of the first plurality of etched lines, the capping insulative material having been deposited prior to etching to form the first plurality of etched lines, the first plurality of etched lines having respective sidewalls, resulting of the first plurality of lines from which the insulative material is removed being shorter than first plurality lines from which the insulative material is not removed;

forming a layer of insulative spacer material over the first plurality of etched lines; and anisotropically etching the layer of insulative spacer material to provide insulative sidewall spacers over said respective etched line sidewalls, the insulative sidewall spacers which are formed relative to the shorter of the first plurality of lines having reduced spacer widths than would otherwise occur in the presence of the removed insulative material.

2. The method of claim 1 comprising removing all of the capping insulative material from said less than all of the first plurality of etched lines.

3. A method of forming conductive lines comprising:

providing a substrate having at least a first area and at least a second area relative to which conductive lines are to be formed;

forming a layer of conductive material over the first and second substrate areas;

forming a first layer of insulative material over the conductive material in the first area while leaving the layer of the conductive material in the second area exposed;

after the forming of the first layer of insulative material and while leaving the layer of the conductive material in the second area exposed, patterning and etching the conductive material and the first layer of insulative material to form at least a first plurality of conductive lines in each of the first and second substrate areas, the first plurality of conductive lines in each of the first and second areas respectively consisting of a singular conductive mass and at least one dielectric layer, the first plurality of conductive lines in each of the first and second substrate areas having respective sidewalls, the first plurality of conductive lines in the first area being capped by the first layer of insulative material;

forming a second layer of insulative material over the substrate including the first layer of insulative material capping the first plurality of conductive lines in the first area; and in at least one common step, anisotropically etching the second layer of insulative material to form insulative spacers about at least some conductive line sidewalls of the first plurality of conductive lines in the first and second substrate areas.

4. The method of claim 3 comprising facet etching the second layer of insulative material.

5. A method of forming conductive lines comprising:

providing a substrate having at least a first area and at least a second area relative to which conductive lines are to be formed;

forming a layer of conductive material over the first and second substrate areas and disposed at a common elevation throughout areas where conductive lines are to be formed;

forming a first layer of insulative material over the conductive material in the first area and not in the second area;

after forming the first layer of insulative material, forming at least a first plurality of patterned conductive lines from the conductive material in the first and second areas, the first plurality of conductive lines in each of the first and second areas respectively consisting of a singular conductive mass and at least one dielectric layer, the first plurality of conductive lines in the first area being capped by the first layer of insulative material, the patterned first plurality of conductive lines in the first and second areas having respective sidewalls, at least some of the first area first plurality of conductive lines having aspect ratios which are greater than aspect ratios of at least some of the second area first plurality of conductive lines;

forming a second layer of insulative material over the substrate and the patterned first plurality of conductive lines in the first and second areas including the first layer of insulative material capping the conductive lines in the first area; and anisotropically etching the second layer of insulative material over the patterned first plurality of conductive lines to form sidewall spacers about individual respective sidewalls of the first plurality of conductive lines in the first and second areas.

6. A method of forming conductive lines comprising:

providing a substrate having at least a first area and at least a second area relative to which conductive lines are to be formed;

forming a layer of conductive material over the first and second substrate areas and disposed at a common elevation throughout areas where conductive lines are to be formed;

forming a first layer of insulative material over the conductive material;

after forming the first layer of insulative material, forming at least a first plurality of patterned conductive lines from the conductive material in the first and second areas, the first plurality of conductive lines in each of the first and second areas respectively consisting of a singular conductive mass and at least one dielectric layer, the first plurality of conductive lines in the first area being capped by the first layer of insulative material, the patterned first plurality of conductive lines having respective sidewalls, at least some of the first area first plurality of conductive lines having aspect ratios which are greater than aspect ratios of at least some of the second area first plurality of conductive lines;

after the forming of the first plurality of patterned conductive lines in the first and second areas, removing first layer insulative material from the first plurality of conductive lines in the second area;

after the removing, forming a second layer of insulative material over the substrate and the patterned first plurality of conductive lines in the first and second areas; and anisotropically etching the second layer of insulative material over the patterned first plurality of conductive lines to form sidewall spacers about individual respective sidewalls of the first plurality of conductive lines in the first and second areas.

7. The method of claim 6 wherein the removing comprises removing all first layer insulative material from the first plurality of conductive lines in the second area.

* * * * *